United States Patent
Major (10) Patent No.: US 8,164,046 B2
(45) Date of Patent: Apr. 24, 2012

(54) ILLUMINATION SYSTEM FOR ILLUMINATING A MASK IN A MICROLITHOGRAPHIC PROJECTION EXPOSURE APPARATUS

(75) Inventor: Andras G. Major, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 461 days.

(21) Appl. No.: 12/504,591

(22) Filed: Jul. 16, 2009

(65) Prior Publication Data
US 2011/0012010 A1      Jan. 20, 2011

(51) Int. Cl.
*G01J 1/20* (2006.01)
(52) U.S. Cl. ........ 250/237 R; 353/71; 359/618; 430/311
(58) Field of Classification Search .............. 250/237 R, 250/237 G; 355/53–71; 359/618, 621; 430/311
See application file for complete search history.

(56) References Cited

U.S. PATENT DOCUMENTS

| 7,061,582 | B2 | 6/2006 | Zinn et al. | |
|---|---|---|---|---|
| 7,515,248 | B2* | 4/2009 | Tanitsu et al. | 355/71 |
| 7,618,767 | B2* | 11/2009 | Toyoda et al. | 430/311 |
| 7,880,969 | B2* | 2/2011 | Wolf et al. | 359/621 |
| 8,004,656 | B2* | 8/2011 | Fiolka et al. | 355/67 |
| 2004/0036977 | A1 | 2/2004 | Tanaka et al. | |
| 2005/0018294 | A1 | 1/2005 | Hauschild | |
| 2006/0087634 | A1 | 4/2006 | Brown et al. | |

FOREIGN PATENT DOCUMENTS

| EP | 1 262 836 | 12/2002 |
|---|---|---|
| WO | WO 2005/026843 | 3/2005 |
| WO | WO 2005/078522 | 8/2005 |
| WO | WO 2008/061681 | 5/2008 |
| WO | WO 2008/095695 | 8/2008 |
| WO | WO/2009/080231 | 7/2009 |

* cited by examiner

*Primary Examiner* — Seung C Sohn
(74) *Attorney, Agent, or Firm* — Fish & Richardson P.C.

(57) ABSTRACT

An illumination system for illuminating a mask in a microlithographic projection exposure apparatus includes an array of mirrors or other beam deflecting elements. Each beam deflecting element produces on the surface a projection light spot at a position that is variable by changing a deflection angle produced by the beam deflecting element. A spot shape measuring unit measures the shapes of spots which are produced on the spot measuring unit by the beam deflecting elements. The spot shape measuring unit is arranged outside of every possible path projection light is allowed to take between the array and the mask. A control unit controls the beam deflecting elements such that, at a given instant during an exposure operation of the apparatus, at least one beam deflecting element directs projection light exclusively on the spot shape measuring unit, and at least some beam deflecting elements direct projection light exclusively on the surface.

14 Claims, 8 Drawing Sheets

ILLUMINATION SYSTEM FOR ILLUMINATING A MASK IN A MICROLITHOGRAPHIC PROJECTION EXPOSURE APPARATUS

FIELD

The disclosure relates to an illumination system for illuminating a mask in a microlithographic projection exposure apparatus microlithographic. More particularly, the disclosure relates to an illumination system including an array of tiltable micromirrors or other beam deflecting elements that are capable of producing light spots in a system pupil plane or on another surface at variable positions. The disclosure further relates to a method of operating an illumination system.

BACKGROUND

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV), vacuum ultraviolet (VUV) or extreme ultraviolet (EUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of a rectangular or curved slit, for example.

The angular distribution of the projection light impinging on the mask is usually adapted to the kind of pattern to be projected onto the photoresist. For example, relatively large sized features may involve a different angular distribution than small sized features. The most commonly used angular distributions of projection light are referred to as conventional, annular, dipole and quadrupole illumination settings. These terms refer to the irradiance distribution in a system pupil surface of the illumination system. With an annular illumination setting, for example, only an annular region is illuminated in the system pupil surface. Thus there is only a small range of angles present in the angular distribution of the projection light, and thus all light rays impinge obliquely with similar angles onto the mask.

Different mechanisms are known in the art to modify the angular distribution of the projection light in the mask plane so as to achieve the desired illumination setting. For achieving maximum flexibility in producing different angular distribution in the mask plane, it has been proposed to use mirror arrays that illuminate the pupil surface.

SUMMARY OF THE DISCLOSURE

In some embodiments, the disclosure provides an illumination system for illuminating a mask in a microlithographic projection exposure apparatus, and also a method of operating such an illumination system, which makes it possible to measure the spot shape during the exposure operation of the apparatus.

In certain embodiments, the disclosure provides a system including a surface and an array of reflective or transparent beam deflecting elements. Each beam deflecting element is configured to produce on the surface a projection light spot at a position that is variable by changing a deflection angle produced by the beam deflection element. The system further includes a spot shape measuring unit which is configured to measure the shapes of spots which are produced on the measuring unit by the beam deflecting element. The spot shape measuring unit is arranged outside of every possible path projection light is allowed to take between the array and the mask. A control unit is provided which is configured to control the beam deflecting elements. This control unit is further configured such that, at a given instant during an exposure operation of the apparatus, at least one beam deflecting element directs projection light exclusively on the spot shape measuring unit, and at least some beam deflecting elements direct projection light exclusively on the surface.

Since the spot shape measuring unit is arranged outside of any possible path projection light is allowed to take between the array and the mask, it cannot interfere with the illumination of the mask. Thus it is possible to perform the measurement during the exposure operation of the apparatus. It does not require a beam splitter or a similar optical component which splits off a certain fraction of projection light. Instead, only one or a few mirrors are tilted so that the projection light beams produced by these mirrors are directed towards the spot shape measuring unit. For example, if the array includes 4000 beam deflecting elements and one element directs a projection light beam on the spot shape measuring unit, while all 3999 remaining beam deflecting elements direct projection light beams towards the system pupil surface and thus contribute to the illumination of the mask, only 1/4000 of the projection light is lost for measurement purposes. This is significantly less light as compared to a configuration in which a beam splitter is arranged within the path of projection light.

The control unit may be configured such that at an interval between two exposures, or even during an interval between consecutive light pulses, one beam deflecting element directs its light beam on the spot shape measuring unit, and (simultaneously) the light beam which had been directed before to the spot shape measuring unit is redirected such that it replaces the spot on the surface which has moved to the spot shape measuring unit. By consecutively switching the spots to and from the surface and the spot shape measuring unit, it is possible to measure the spot shape very quickly for all beam deflecting elements of the array.

The surface where the spots are produced may be the system pupil surface of the illumination system, or a surface which is optically conjugated thereto. Thus this surface may be "imaginary", i.e. there is no solid or liquid material defining this surface. However, this surface may coincide with a surface of an optical component, for example an optical integrator. Such optical integrators may be formed by a rod or an optical raster element, for example a fly's eye lens or a diffractive optical element.

In some embodiments, the surface extends in a plane which intersects the spot shape measuring unit. In other words, the spot shape measuring unit is arranged outside the usual area of the surface which exclusively contributes to the illumination of the mask, but is still positioned very close to this usable area. For example, the spot shape measuring unit may be spaced apart from the area by a distance which is less than one fifth of a maximum diameter of the area. By arranging the spot shape measuring unit close to the surface it is ensured that the spot produced on the spot shape measuring unit by a particular beam deflecting element is very similar to the spot which is produced on the usable area of the surface. Any deviations between shapes of spots produced with different deflection angles by a single beam deflecting element may be taken into account by calibration, for example.

In some embodiments, the control unit is configured to control the at least one beam deflecting element such that the spot produced by the at least one beam deflecting element moves over a detector surface of the spot shape measuring unit during the spot shape measurement.

This makes it possible to use a detector having a small number of detector pixels or similar sensor elements which simplifies the layout of the detector and also the processing of the measurement values produced by the sensor elements. This approach exploits the fact that it is desirable anyway to be able to control the spot position very accurately in order to obtain exactly the irradiance distribution in the system pupil surface which is desired. This accuracy is also available when the spot is moved over a detector surface in a kind of scanning movement such that the irradiance distribution is not detected in one go, but assembled from a plurality of single measurements performed at different locations of the spot.

In certain embodiments, the sensor elements are spaced apart by a significant distance. For example, the detector may have a detector surface that includes an array of sensor elements each having a light entrance window. The sensor elements are spaced apart along a direction (which is arbitrary) by a distance that is greater than the length of the light entrance windows along the direction. This distance may be, for example, at least three times the maximum dimension of a light entrance window. Such an arrangement of spaced apart sensor elements makes it possible to use sensor elements that may otherwise not be easily densely packed. For example, it is difficult to pack individual photodiodes such that the detector surface is quasi-contiguous. However, it is easy to assemble a small number of such photodiodes, for example four or sixteen, such that they are spaced apart by significant distances. In the extreme case the spot shape measuring unit has only a single detector pixel.

If the spot shape measuring unit has a shutting function such that is detects the irradiance very quickly, the spot may move continuously over the detector surface.

Otherwise the control unit should be configured to control the at least one beam deflecting element such that the spot moves intermittently over the detective surface. In order to keep the distances and thus the velocity of the spot movements small, the control unit may be configured to control the at least one beam deflecting element such that the spot meanders over the detector surface.

It is to be noted that this concept is also applicable for EUV illumination systems which may include arrays of tiltable mirrors. In such EUV projection exposure apparatus the projection light has a wavelength below 25 nm, such as about 13.6 nm. In this case the spot shape measuring unit may be formed by a scintillation detector, including a scintillator and an electronic light sensor. The scintillator transforms the wavelength into a longer wavelength which can be detected by the electronic light sensor.

If a computer shall be able to computationally assemble several thousand spots of different shapes so as to achieve the desired irradiance distribution in the system pupil surface, it is, at least under real time conditions, not feasible to describe the shape of the spots with raw data, for example a set of 100×100 irradiance values.

In some embodiments, this problem is solved by an evaluation unit which is configured to compute, on the basis of measurement values produced by the spot shape measurement unit, a set of parameters that describe the shape of a measured spot. This exploits the fact that the shapes of the spots will usually be similar and may be approximated by simple geometric shapes, for example polygons or ellipses. Then the shape of each spot can be described with a few parameters, and only this set of parameters is provided to the computer which computationally assembles the spots in the system pupil surface.

In many cases the spots have approximately the shape of an ellipse. Then these parameters may include the center of the ellipse and the length and orientation of the principles axes of the ellipse. These parameters may be determined on the basis of mathematical moments $M_{ij}$ given by $$M_{ij} = \sum_{x,y} x^i y^j f(x, y)$$

x and y are coordinates where irradiances f(x, y) are measured by the spot shape measuring unit. It has been found that the length and the orientation of the principal axes of an ellipse can be computed very effectively, i.e. involving only simple computational approaches, if a set of irradiancies measured at different coordinates are supplied to the evaluation unit.

The beam deflecting elements enable to direct light rays impinging on the elements into various directions, wherein the directions can be changed individually for each element.

In some embodiments the beam deflecting elements are formed by mirrors that can be tilted about at least one tilt axis. The array may include several hundreds or several thousands of such tiltable mirrors.

In certain embodiments the beam deflecting elements are formed by electro-optical or acousto-optical elements. In such elements the refractive index may be varied by exposing a suitable material to ultrasonic waves or electric fields, respectively. These effects can be exploited to produce index gratings that direct impinging light into various directions.

In some embodiments, the disclosure provides a method of operating an illumination system for illuminating a mask in a microlithographic projection exposure apparatus, wherein the method includes the following steps:

a) producing a plurality of projection light beams;
b) directing at least one projection light beam on a spot shape measuring unit that is arranged outside of every possible path projection light is allowed to take between the array and the mask;
c) measuring the shape of a spot that is produced by the at least one projection light beam on the spot shape measuring unit;
d) directing the other projection light beams on a surface, wherein at least a portion of the light on the surface contributes to an illumination of the mask.

In certain embodiments, the at least one projection light beam moves over a detective surface of the spot shape measuring unit during the spot shape measurement.

In some embodiments, a set of parameters, which describe the shape of a measured spot, is computed on the base of measurement values produced by the spot shape measuring unit. If the spots have approximately the shape of an ellipse, the parameters may include the center of the ellipse and the length and orientation of the principles axes of the ellipse.

In certain embodiments, the method includes the further steps of e) measuring the shape of a spot produced by the at least one projection light beam on the spot shape measuring unit; and f) arranging the spots on the surface, thereby taking into account the shapes of the spots measured in step d).

BRIEF DESCRIPTION OF THE DRAWINGS

Various features and advantages of the present disclosure may be more readily understood with reference to the following detailed description taken in conjunction with the accompanying drawing in which.

DETAILED DESCRIPTION

I.

General Structure of Projection Exposure Apparatus

Figure 1:
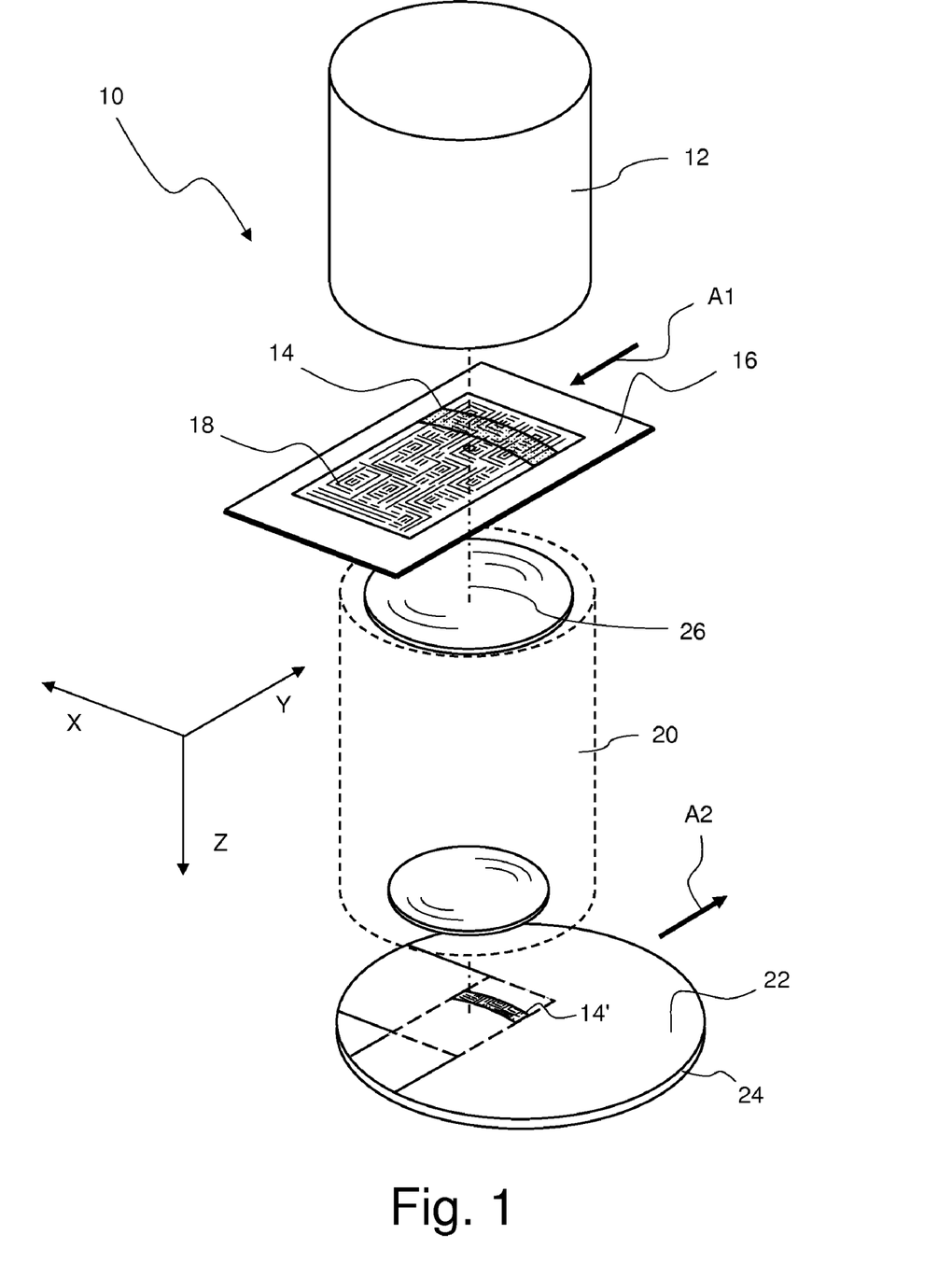
FIG. 1 is a perspective and considerably simplified view of a projection exposure apparatus in accordance with the present disclosure.

FIG. 1 is a perspective and highly simplified view of a projection exposure apparatus 10 that includes an illumination system 12 for producing a projection light beam. The projection light beam illuminates a field 14 on a mask 16 containing minute structures 18. In this exemplary embodiment the illuminated field 14 has approximately the shape of a ring segment. However, other, for example rectangular, shapes of the illuminated field 14 are contemplated as well.

A projection objective 20 images the structures 18 within the illuminated field 14 onto a light sensitive layer 22, for example a photoresist, which is deposited on a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned by a mask stage (not shown) in an object plane of the projection objective 20. Since the latter has a magnification $\beta$ with $|\beta|<1$, for example $\beta=1:4$, aminified image 14' of the structures 18 within the illuminated field 14 is projected onto the light sensitive layer 22.

During the projection, the mask 16 and the substrate 24 move along a scan direction which coincides with the Y direction. Thus the illuminated field 14 scans over the mask 16 so that structured areas larger than the illuminated field 14 can be continuously projected. Such a type of projection exposure apparatus is often referred to as "step-and-scan apparatus" or simply a "scanner". The ratio between the velocities of the substrate 24 and the mask 16 is equal to the magnification of the projection objective 20. If the projection objective 20 inverts the image, the mask 16 and the substrate 24 move in opposite directions, as this is indicated in FIG. 1 by arrows A1 and A2. However, the present disclosure may also be used in stepper tools in which the mask 16 and the substrate 24 do not move during projection of the mask.

In the exemplary embodiment shown, the illuminated field 14 is not centered with respect to an optical axis 26 of the projection objective 20. Such an off-axis illuminated field 14 may be desirable with certain types of projection objectives 20. In some embodiments, the illuminated field 14 is centered with respect to the optical axis 26.

EUV projection exposure apparatus have the same basic structure. However, because there are no optical materials that are transparent for EUV radiation, only mirrors are used as optical elements, and also the mask is of the reflective type. Further details will be explained below in section VII.

II.

General Structure of Illumination System

Figure 2:
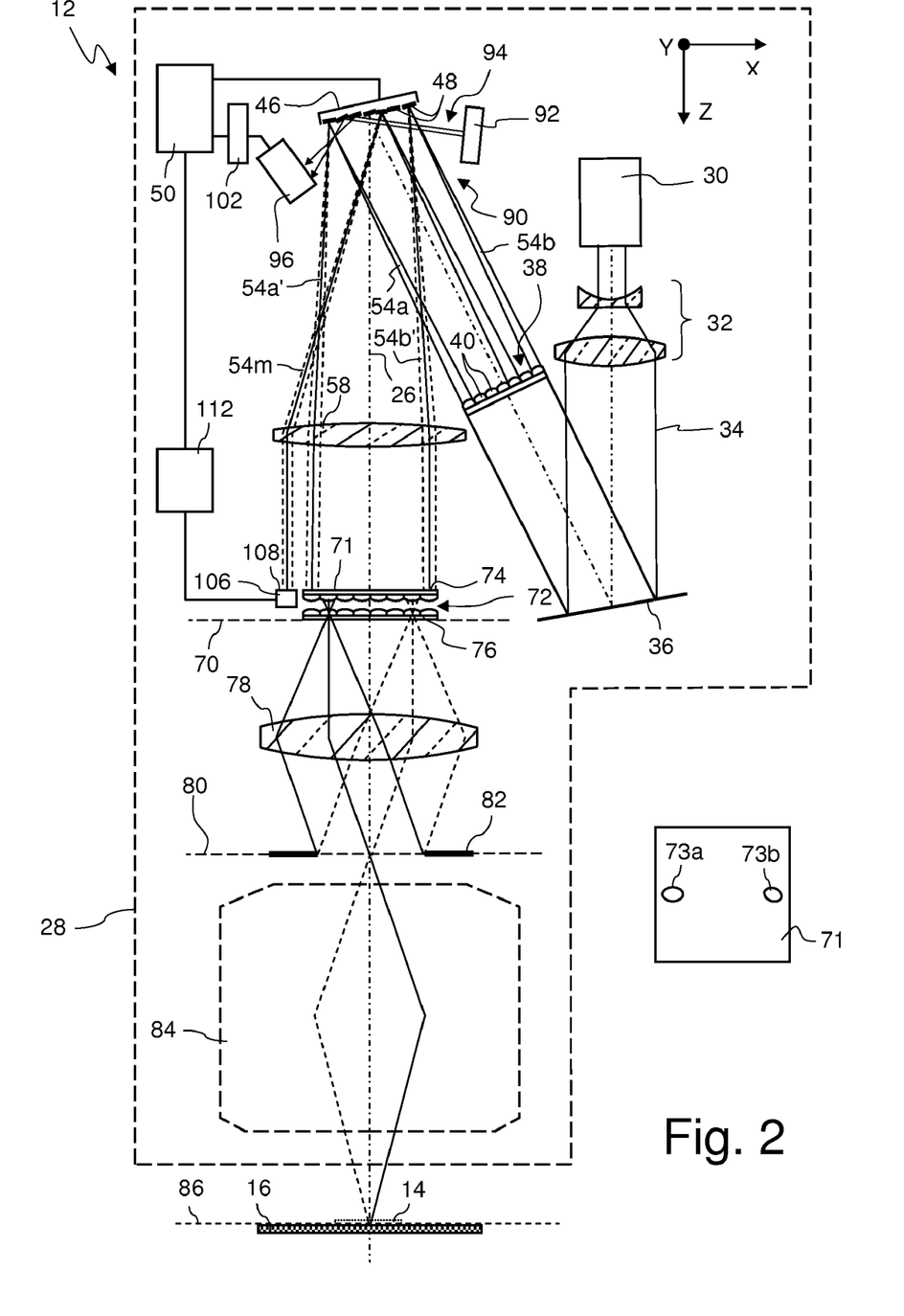
FIG. 2 is a meridional section through an illumination system contained in the projection exposure apparatus shown in FIG. 1.

FIG. 2 is a more detailed meridional section through the illumination system 12 shown in FIG. 1. For the sake of clarity, the illustration of FIG. 2 is considerably simplified and not to scale. This particularly implies that different optical units are represented by very few optical elements only. In reality, these units may include significantly more lenses and other optical elements.

The illumination system 12 includes a housing 28 and a light source that is, in the exemplary embodiment shown, realized as an excimer laser 30. The excimer laser 30 emits projection light that has a wavelength of about 193 nm. Other types of light sources and other wavelengths, for example 248 nm or 157 nm, are also contemplated.

In the exemplary embodiment shown, the projection light emitted by the excimer laser 30 enters a beam expansion unit 32 in which the light beam is expanded without altering the geometrical optical flux. The beam expansion unit 32 may include several lenses as shown in FIG. 2, or may be realized as a mirror arrangement, for example. The projection light emerges from the beam expansion unit 32 as a substantially collimated beam 34. In certain embodiments, this beam may have a significant divergence. The collimated beam 34 impinges on a plane folding mirror 36 provided for reducing the overall dimensions of the illumination system 12.

After reflection from the folding mirror 36, the beam 34 impinges on an array 38 of microlenses 40. A mirror array 46 is arranged in or in the vicinity to a back focal plane of the microlenses 40. As will be explained in more detail below, the mirror array 46 includes a plurality of small individual mirrors 48 that can be tilted, independently from each other, by two tilt axes that can be aligned perpendicularly to each other. The total number of mirrors 48 may exceed 100 or even several 1000. The reflecting surfaces of the mirrors 48 may be plane, but could also be curved if an additional reflective power is desired. Apart from that the mirror surfaces may support diffractive structures. In this exemplary embodiment the number of mirrors 48 is equal to the number of microlenses 40 contained in the microlens array 38. Thus each microlens 40 directs a converging light beam 54a, 54b on one mirror 48 of the mirror array 46.

The tilt movements of the individual mirrors 48 are controlled by a mirror control unit 50. Actuators, which are used to set the desired tilt angles of the mirrors 48, receive control signals from the mirror control unit 50 such that each individual mirror 48 is capable of reflecting an impinging light ray by a reflection angle that is variable in response to the control signal. In the exemplary embodiment shown there is a continuous range of tilt angles at which the individual mirrors 48 can be arranged. In some embodiments, the actuators are configured such that only a limited number of discrete tilt angles can be set.

Figure 3:
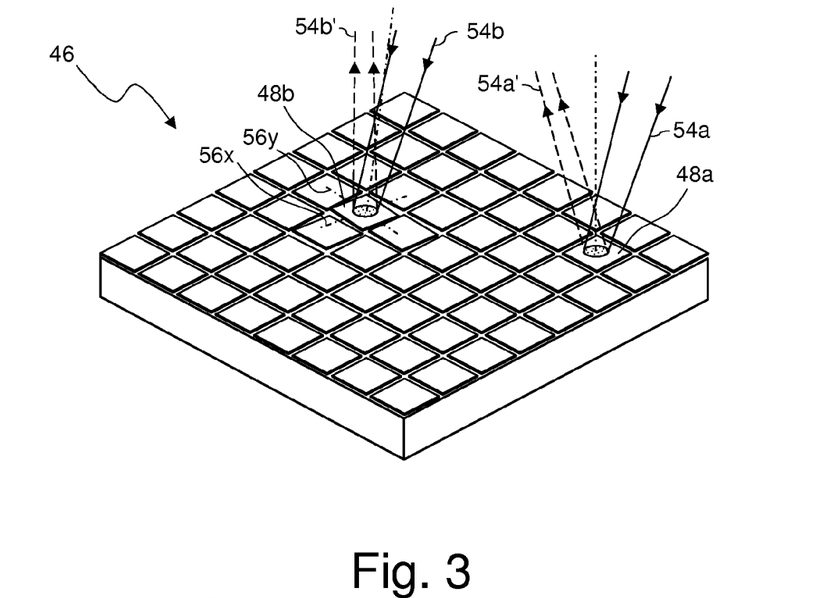
FIG. 3 is a perspective view of a mirror array contained in the illumination system of FIG. 2.

FIG. 3 is a perspective view of the mirror array 46 including, for the sake of simplicity, only 8·8=64 mirrors. Light beams 54a, 54b impinging on mirrors 48a and 48b, respectively, of the array 46 are reflected into different directions depending on the tilt angles of the mirrors 48a, 48b. For the mirror 48b the tilt axes are denoted by 56x, 56y in FIG. 3. As a result of the different tilt angels of the mirrors 48a, 48b, light beams 54a', 54b' reflected from these two mirrors 48a, 48b have different directions.

Referring again to FIG. 2, the light beams 54a', 54b' reflected from the mirrors 48a, 48b impinge on a first condenser 58. The first condenser 58 ensures that the slightly diverging light beams 54a', 54b' impinge, now as at least substantially parallel light beams, on an entrance surface 71 of an optical integrator 72. Each reflected light beam 54a', 54b' illuminates a small spot 73a and 73b, respectively, on the entrance surface 71, as it is illustrated in the top view on the surface 71 shown at the right hand side of FIG. 2.

The optical integrator 72 produces a plurality of secondary light sources and increases the range of angles formed between the light rays and an optical axis 26 of the illumination system 12. In certain embodiments, the first condenser 58 is dispensed with so that the reflected light beams 54a', 54b' impinging on the optical integrator 72 have a larger divergence.

The optical integrator 72 is realized, in the exemplary embodiment shown, as a fly's eye lens including two substrates 74, 76 that each supports two orthogonal arrays of parallel cylindrical microlenses. Other configurations of the optical integrator are envisaged as well, for example integrators including an array of microlenses that have rotationally symmetrical surfaces, but rectangular boundaries. Reference is made to WO 2005/078522 A, US 2004/0036977 A1 and US 2005/0018294 A1, in which various types of optical integrators suitable for the illumination system 12 are described.

Reference numeral 70 denotes a system pupil surface of the illumination system 12. The irradiance distribution in the system pupil surface 70 substantially defines the angular distribution of the light impinging on the mask 14. The system pupil surface 70 is usually plane or slightly curved and is positioned in or in immediate vicinity to the optical integrator 72. As the angular light distribution in the system pupil surface 70 directly translates into an irradiance distribution in a subsequent field plane, the optical integrator 72 substantially determines the basic geometry of the illuminated field 14 on the mask 16. Since the optical integrator 72 increases the range of angles considerably more in the X direction than in the scan direction Y, the illuminated field 14 has larger dimensions along the X direction than along the scan direction Y.

The projection light emerging from the secondary light sources produced by the optical integrator 72 enters a second condenser 78 that is represented in FIG. 2 by a single lens only for the sake of simplicity. The second condenser 78 ensures a Fourier relationship between the system pupil surface 70 and a subsequent intermediate field plane 80 in which a field stop 82 is arranged. The second condenser 78 superimposes the light bundles, which are produced by the secondary light sources, in the intermediate field plane 80, thereby achieving a very homogeneous illumination of the intermediate field plane 80. The field stop 82 may include a plurality of movable blades and ensures sharp edges of the illuminated field 14 on the mask 16.

A field stop objective 84 provides optical conjugation between the intermediate field plane 80 and the mask plane 86 in which the mask 16 is arranged. The field stop 82 is thus sharply imaged by the field stop objective 84 onto the mask 16.

III.

Tilt Angle Measuring Unit

The orientation of the mirrors, i.e. the tilt angles with regard to the tilt axes 56x, 56y (see FIG. 3), has to be controlled very accurately. This is because the pattern produced on the light sensitive surface 22 is very sensitive to variations of the irradiance distribution in the system pupil plane 70, which depends on the orientation of the mirrors 48.

The orientation of the mirrors 48 can only be controlled accurately if it is possible to measure the orientation of the mirrors 48 individually. To this end the illumination system 12 includes a tilt angle measuring unit 90 which is configured to direct measuring light beams on each mirror 48 and to measure the direction of measuring light beams reflected therefrom.

The tilt angle measuring unit 90 measures for each mirror 48 a parameter (for example a surface normal) which is suitable to describe the orientation of the mirror 48 to be measured. The tilt angle measuring unit 90 feeds the measured parameter to the control unit 50. The latter may then readjust some or all mirrors 48 if the deviations between the measured mirror orientations and the target orientations exceed predetermined threshold values.

Figure 4:
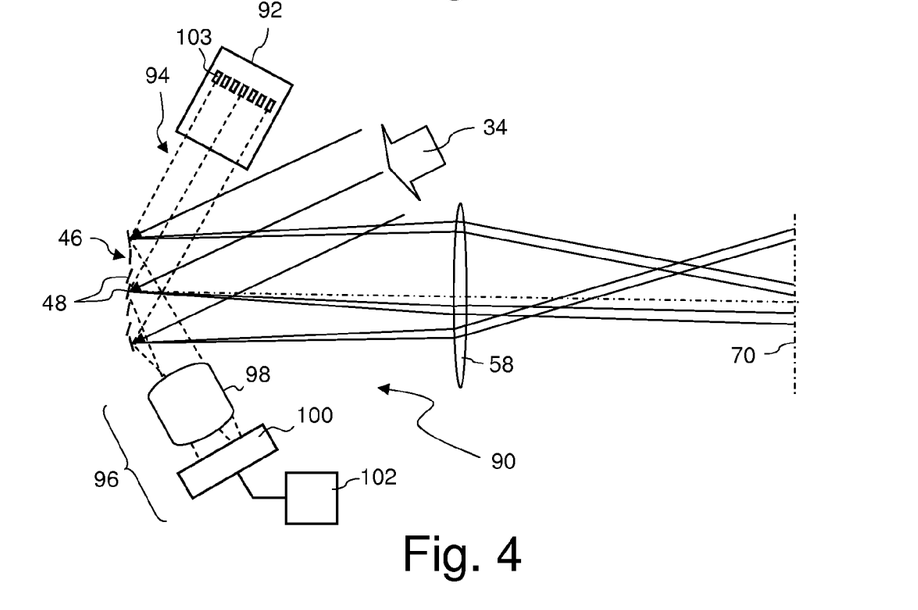
FIG. 4 is an enlarged cutout of FIG. 2 showing a tilt angle measuring unit.

The general structure of the tilt angle measuring unit 90 will now be explained with reference to FIG. 2 and also to FIG. 4 which is an enlarged and more detailed cutout of FIG. 2:

The tilt angle measuring unit 90 includes an illumination unit 92 which directs an individual measuring light beam 94 to each mirror 48. After reflection from the mirrors 48 the measuring light beams 94 enter a detector unit 96 including detector optics 98 and a position resolving sensor 100. The detector optics 98 may include a condenser which translates the directions of the reflected measuring light beams 94 into positions on the position resolving sensor 100. The positional data obtained by the sensor 100 are supplied to a processing unit 102 which is configured to determine the orientation of the mirrors 48 on the basis of the directions of the reflected measuring light beams 94 measured by the detector unit 96. These data are then fed to the control unit 50, as has been explained above. More details with regard to the detector unit 96 are described in WO 2008/095695 A1 that has been mentioned at the outset.

In order to be able to measure the orientation of each mirror 48 individually, the measurement device 92 has to be capable of identifying from which mirror 48 a detected measuring light beam 94 has been reflected. One approach in this respect is to use an illumination unit 92 including a plurality of individual illumination members 103. Each member 103 produces a measuring light beam 94 which is directed to one of the mirrors 48. Since the illumination members 103 can be controlled individually, it is possible to use optical multiplexing, for example in the time or frequency domain, to distinguish the measuring light beams 94 detected by the sensor 100.

IV.

Spot Shape Measuring Unit

As has been mentioned before, the irradiance distribution in the system pupil surface 70 substantially defines the angular distribution of the projection light impinging on the mask 16. The optical integrator 72 introduces an additional divergence, but does not substantially modify the irradiance distribution of projection light impinging on its entrance surface 71. Consequently, the irradiance distribution on the entrance surface 71 of the optical integrator 72 is at least approximately identical to the irradiance distribution in the system pupil surface 70. For that reason the angular distribution in the mask plane 86 may equally be described by an irradiance distribution on the entrance surface 71 of the optical integrator 72.

The control unit 50 has to control the mirrors 48 such that a desired irradiance distribution on the entrance surface 71 is achieved. To this end the control unit 50 has to assemble the individual spots 73a, 73b produced by the reflected projection light beams 54a', 54b' in a suitable manner. This can be accomplished only if the shapes of the spots 73a, 73b are individually known for all reflected projection light beams 54a', 54b'.

Generally, the term "spot shape" is used in this application to denote the complete irradiance distribution of a spot. However, if the irradiance distribution within a spot is sufficiently homogeneous, the spot shape can be sufficiently described by the circumference of the spot only. Then a spot shape measurement merely provides data describing the circumference of the spots. For example, if the circumference approximates a general type of geometry (e.g. a polygon or an ellipse), a few parameters may suffice to fully describe the spot shape. In the case of an ellipse, these parameters may include the center of the ellipse and the length and orientation of its principal axes.

The shape of the spots 73a, 73b may change significantly during the operation of the apparatus 10. Such changes may be caused by thermal effects that tend to change the optical properties of the optical elements involved. For example, the microlenses 40 of the microlens array 38 may deform under the influence of heat dissipated during the operation of the apparatus 10. This is because the mirrors 48 absorb a (small) fraction of light, and the temperature change may be significant because the mirrors 48 have a small thermal capacity.

For that reason the illumination system 12 includes a spot shape measuring unit 106 that is capable of measuring the shape of spots produced by projection light beams 54a', 54b' impinging on a detector surface 108 of the spot shape measuring unit 106.

The detector surface 108 of the spot shape measuring unit 106 is arranged in a plane which extends through the (in this exemplary embodiment rippled) entrance surface 71 of the optical integrator 72. Transversely, i.e. in a direction perpendicular to the optical axis 26 of the illumination system, the detector surface 108 is arranged very close to the entrance surface 71 of the optical integrator 72. This ensures that the spot shapes measured on the detector surface 108 are very similar to the spot shapes that would be produced by the mirrors 48 on the entrance surface 71 of the optical integrator 72. Any residual deviations may be taken into account computationally.

The detector surface 108 of the spot shape measuring unit 106 may also be arranged adjacent to the first condenser 58 in a plane which extends through the first condenser 58 or upstream in the vicinity of the first condenser 58 under the condition, that it is arranged outside of every possible path projection light is allowed to take between the array 46 and the mask 16.

In the exemplary embodiment shown the entrance surface 71 of the optical integrator 72 has a maximum usable area, i.e. an area that exclusively contributes to the illumination of the mask 16. In order to keep deviations between the spot shapes measured on the detector surface 108 and the entrance surface 71 as small as possible, the detector surface 108 should be spaced apart from the usable area on the entrance surface 71 by a distance which is less than $\frac{1}{5}$ of the maximum diameter of the area, such as by a distance which is less than $\frac{1}{10}$ of this maximum diameter.

Figure 5:
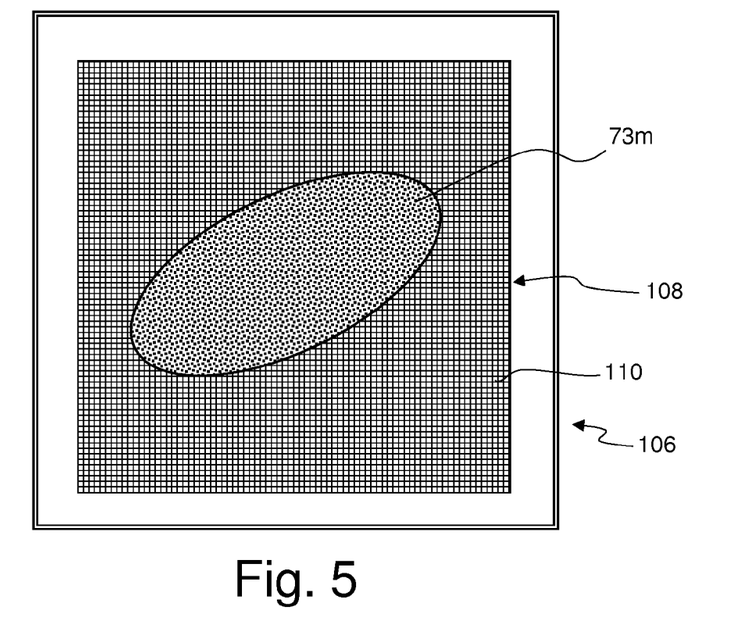
FIG. 5 is a top view on a spot shape measuring unit including a CCD sensor.

FIG. 5 is a top view on the spot shape measuring unit 106. The detector surface 108 is formed, in the exemplary embodiment shown, by a CCD sensor which includes an array of 256×256 sensor elements 110. The detector surface 108 is sufficiently large so that a spot 73m associated with any of the mirrors 48 will always, i.e. under every conceivable operating condition, be smaller than the detector surface 108. Then the spots 73m can be detected in one go if the spot 73m is suitably positioned on the detector surface 108.

For the control unit 50 it will be computationally difficult to assemble in real time the spots 73a, 73b on the entrance surface 71 of the optical integrator 72 if the spot shape measuring unit 106 provides for each of the sensor elements 110 raw data representing irradiances. Therefore the illumination system 12 includes an evaluation unit 112 which is configured to compute, on the basis of the measurement values produced by the spot shape measuring unit 106, quantities that describe the shape of a measured spot more effectively. This means that these quantities are associated with a smaller data volume than the raw data provided by the sensor elements 110.

In some embodiments these quantities are a set of parameters that is suitably selected in view of the expected general shape of the measured spots. For example, in the exemplary embodiment shown it is assumed that the measured spots 73m have approximately the shape of an ellipse. Then the parameters may include the center of the ellipse and also the length and the orientation of the principal axes of the ellipse. The spot shape can then be described by five numerical values, only. A very effective computation of these parameters on the basis of raw data will be described in more detail below in section VI. If the inhomogeneities of the irradiance distribution with a spot shall be taken into account, some additional parameters, for example parameters describing a parabolic irradiance profile along a certain direction, may be computed by evaluation unit 112 to this end.

In the following the function of the spot shape measuring unit 106 will be described in more detail:

In some embodiments the control unit 50 controls the mirror 48 in such a way that a small subset of mirrors 48 including only a few, for example 12, mirrors 48, do not direct projection light beams on the surface 71 of the optical integrator 72 during an exposure cycle of the apparatus. An exposure cycle is defined as the time period during which a limited but continuous portion on the light sensitive layer 22 is exposed by the projection light, either in a scanning process or in one step. Such a control implies that the irradiance distribution produced on the entrance surface 71 of the optical integrator 72 is exclusively produced by the projection light beams 54a', 54b' associated with the remaining mirrors 48. If the mirror array 46 includes, for example, 4096 mirrors 48, the absence of projection light reflected by a subset of 12 mirrors 48 will not have a significant effect on the total irradiance on the entrance surface 71 (less than 0.03% light loss).

During the exposure cycle the shapes of the spots associated with the subset of mirrors 48 are successively measured. To this end all but one mirror 48 of the subset are brought into an off-state such that the reflected projection light beams are directed on an absorbent surface (not shown). The remaining one mirror 48 of the subset is controlled by the control unit 50 such that the reflected projection light beam 54m associated with this particular mirror 48 impinges on the detector surface 108 of the spot shape measuring unit 106. The irradiance distribution of the spot 73m produced in this way is measured, and the evaluation unit 112 computes from the raw data produced by the spot shape measuring unit 106 a set of parameters. These parameters, which describe the shape of the measured spot 73m, are fed to the control unit 50. As has already been the, this measurement is performed during the exposure cycle, i.e. while the mask 16 is illuminated.

Then, still during the same exposure cycle, the spot 73m associated with another mirror 48 of the mirror subset is measured in the same manner. This implies that the spot 73m that has been produced on the detector surface 108 is aimed at the absorbent surface, and a spot that has been produced on the absorbent surface is aimed at the detector surface 108. The control unit 50 therefore has to ensure that one after the other mirror 48 of the subset is controlled such that it directs the reflected light beam on the detector surface 108, while all other mirrors 48 of the subset are in an off-state. These measurements of individual spots are repeated until all spots produced by the subset of mirrors are measured.

When the exposure cycle is terminated, the subset of mirrors 48 is incorporated again into the set of mirrors that contribute to the irradiance distribution on the entrance surface 71 of the optical integrator 72. Another subset of mirrors 48 is then selected that will be the subject of the next measurements during the following exposure cycle. In this way the spot shapes associated with all mirrors 48 of the array 46 can be successively measured with only a single spot shape measuring unit 106.

From the foregoing it becomes clear that the total measurement time may be reduced if more than one spot shape measuring unit 106 is provided. Such additional spot shape measuring units 106 may be arranged such that they are evenly distributed around the circumference of the entrance surface 71 of the optical integrator 72. It is also envisaged to use spot shape measuring units 106 having a larger detector surface 108 so that not only one, but a plurality of spots 73m can be detected in one go by the spot shape measuring unit 106.

V.

Alternative Embodiments

In the following embodiments of the spot shape measuring units 106 will be described with reference to FIGS. 6 to 10.

If the detector surface 108 is formed by a CCD sensor, each measurement of a spot 73m produces a huge amount of raw data that has to be processed by the evaluation unit 112. This is because the commercially available CCD sensors have very small and densely packed sensor elements 110. As a result the irradiance distribution of the spot 73m is measured with a very high spatial resolution. However, the control unit 50 often involves only some parameters or other quantities that roughly describe the shape of the spots 73m. For computing such parameters or quantities it is not necessary to use a detector having a very high spatial resolution.

Figure 6:
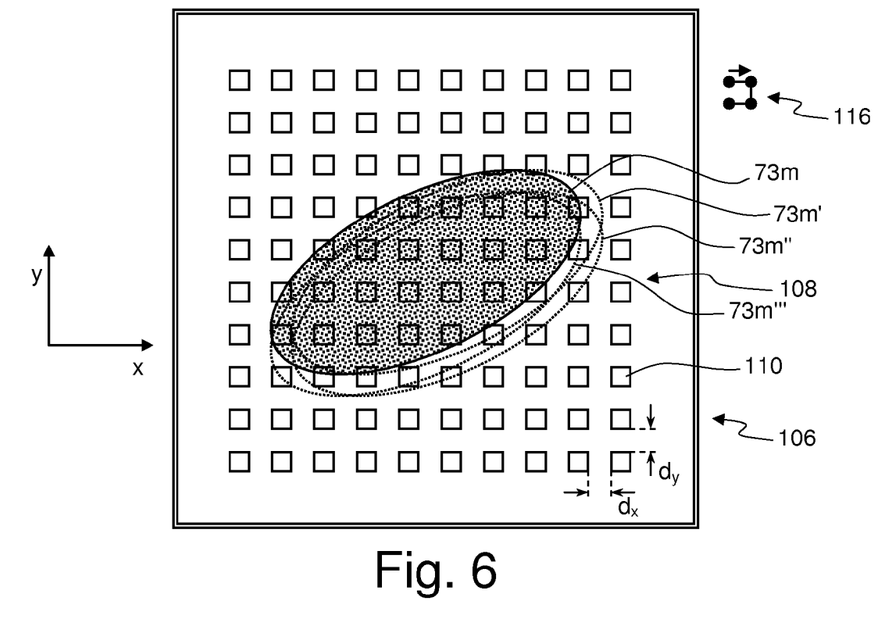
FIG. 6 is a top view on a spot shape measuring unit including a 10×10 array of photodiodes.

At present there are no CCD sensors available having the desired total detector area but a smaller spatial resolution. One approach to tackle this problem is illustrated in FIG. 6 which is a top view on an exemplary alternative embodiment of a spot shape measuring unit 106. Here the sensor elements 110 of the detector surface 108 are formed by photodiodes which have a larger light entrance window than CCD sensor elements. The sensor elements 110 are arranged as a 10×10 array, with gaps of width $d_x$, $d_y$ remaining between adjacent light entrance windows of sensor elements 110. These gaps occur because the photodiodes 114 cannot be easily mounted such that their light entrance windows form a quasi-continuous area. In this exemplary embodiment the gaps are determined such that their widths $d_x$, $d_y$ and the side lengths of the sensor elements 110 are all equal.

Due to the large sized light entrance windows and the gaps between the sensor elements 110, the spatial resolution for measuring a spot 73m could be too small. In order to compensate for this, the control unit 50 is configured to control the mirror 48, which is associated with the spot 73m to be measured, such that the spot 73 moves over the detector surface 108 during the spot shape measurement. More particularly, after a first measurement of the spot 73m in the position indicated in FIG. 6 by a darker filling, the spot 73m moves one gap width $d_x$ along the +x direction. The spot position after this movement is indicated in FIG. 6 by a dotted line 73m'. Then a measurement is performed at this displaced spot position 73m'. In a next step the spot moves one gap width $d_y$ along the −y direction. The position of the spot after this second movement is indicated in FIG. 6 by a dotted line 73m". After another measurement has been performed, the spot moves again, but this time in the −x direction by a distance $d_x$ until it reaches a position indicated by 73m'''. Then the last measurement for this spot is performed.

This sequential measurement of a single spot makes it possible to obtain measurement values for the complete spot area although the photodiodes 114 are spaced apart by distances $d_x$, $d_y$. This sequential measurement takes advantage of the fact that the mirrors 48 can be controlled very accurately with the help of the control unit 50 and the tilt angle measuring unit 90. Thus it is possible to accurately move the spot over the detector surface 108 and to break down the measurement of the complete spot area into a sequence of n measurements, with n being the inverse filling ratio of the sensor elements 110 on the detector surface 108. The risk of undesired mirror oscillations is small since the movements of the spots between successive measurements, and thus the tilt angle variations of the mirrors 48, are very small.

At the right-hand side of FIG. 6 a movement pattern 116 is shown that illustrates the sequence of measurements (black dots) which is performed between the movements of the spot 73m.

Figure 7:
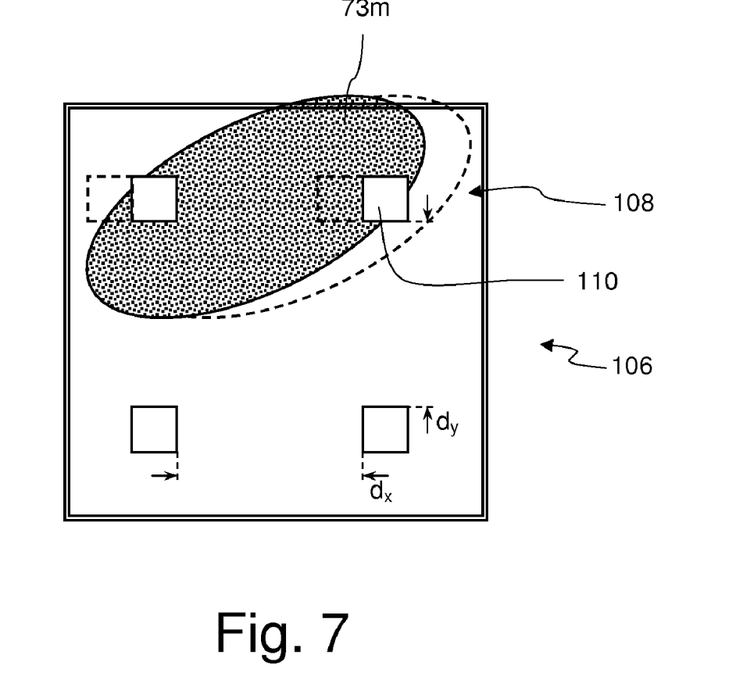
FIG. 7 is a top view on spot shape measuring unit including four photodiodes.

FIG. 7 is a top view on a spot shape measuring unit 106. In this exemplary embodiment the spot shape measuring unit 106 includes only 4 sensor elements 110 formed again by photodiodes. The sensor elements 110 are arranged regularly at the corners of a square. In this exemplary embodiment each sensor element 110 has a light entrance window which is four times as large as the light entrance window of the sensor elements used in the exemplary embodiment shown in FIG. 6. Apart from that the gap widths $d_x$, $d_y$ are four times the length of the light entrance windows of the sensor elements 110 along the x and y direction, respectively.

Figure 8:
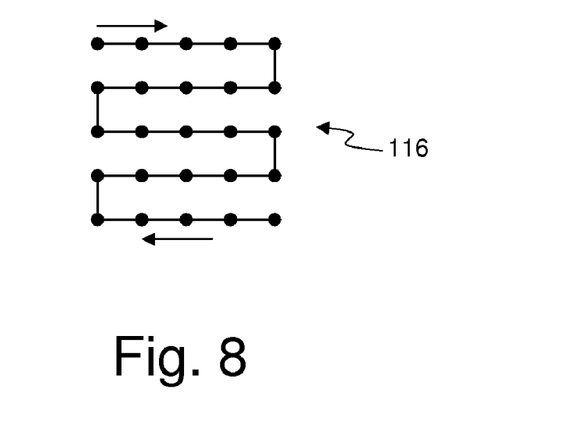
FIG. 8 is a schematic illustration of the meandering movement of the spot over the spot shape measuring unit shown in FIG. 7.

If a spot 73m moves over the detector surface 108 in compliance with the meandering movement pattern 116 shown in FIG. 8, each position on the spot 73m will be detected during a complete measurement cycle by one of the four sensor elements 110. The measurement cycle includes 5×5=25 single measurements with four photodiodes 114. This results in 100 measurement values for the spot 73m. This is four times less than what is obtained with the spot shape measuring unit 106 shown in FIG. 6 because the spatial resolution is also reduced by a factor of 4 as a result of the larger detector area of the sensor elements 110.

The advantage of the spot shape measuring unit 106 shown in FIGS. 7 and 8 is that the layout of the detector surface 108 is particularly simple. Furthermore the measurement raw data are produced in more, but smaller bursts which simplifies their processing.

Figure 9:
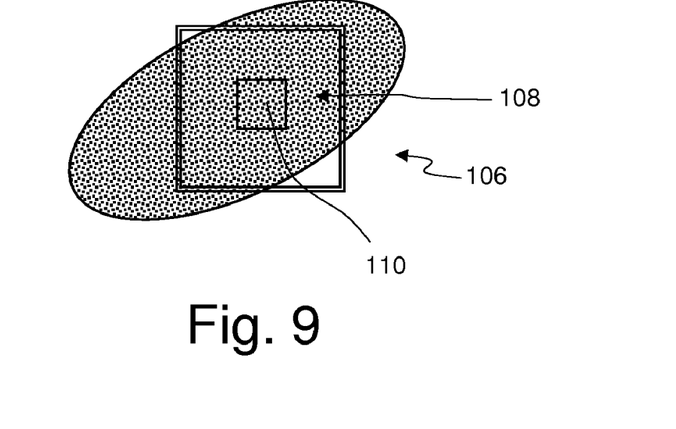
FIG. 9 is a top view on a spot shape measuring unit including only a single photodiode.
Figure 10:
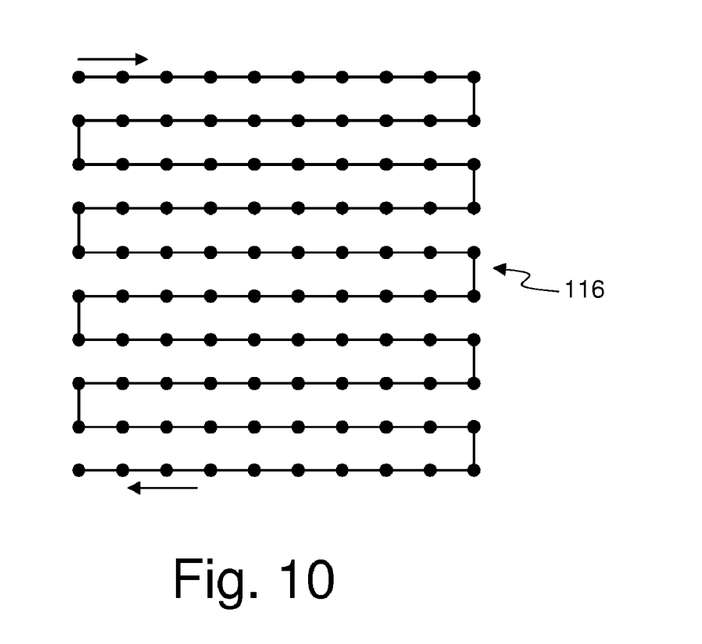
FIG. 10 is a schematic illustration of the meandering movement of the spot over the spot shape measuring unit shown in FIG. 9.

FIG. 9 is a top view on a spot shape measuring unit 106. In this exemplary embodiment the detector surface 108 includes only one sensor element which is again formed by a photodiode 110. As becomes clear from the movement pattern 116 shown in FIG. 10, a complete measurement cycle includes a total of 100 single measurements. This further simplifies the layout of the spot shape measuring units 106 and the evaluation unit 112, but involves more time for a complete spot shape measurement.

VI.

Parametric Spot Shape Description

As has been explained above, the evaluation unit 112 reduces the amount of raw data so that the control unit 50 is capable of quickly assembling the spots produced by the mirror 48 to a desired irradiance distribution on the entrance surface 71 of the optical integrator 72. In the following an approach will be described how the evaluation unit 112 computes, on the basis of the raw data produced by the spot shape measurement unit 106, a set of parameters that describe the shape of a measured spot 73m.

This approach will be explained under the assumption that the spots 73m have approximately the shape of an ellipse. In this case the parameters include the length and the orientation of the principal axes of the ellipse and its center. However, a parametric description is also possible for other shapes. For example, if the microlenses 40 of the array 38 have a square circumference, the spots 73m may have approximately the shape of (skewed) rectangles. In this case the parameters may be the components of vectors that describe the position, the length and the orientation of two adjacent sides of the rectangle.

The task is to derive, from raw data representing measurement values that are subject to measurement errors and noise, a few parameters with minimum computational power. In particular, the amount of data which has to be processed in each step should be small. For that reason complicated iterative methods, as they usually occur if parametric curves are fitted to measurement values, should be avoided.

In the following it will be assumed that the irradiance on the detector surface 108 is known at any arbitrary point with high accuracy. This irradiance distribution is given by a function $f(x, y)$. In a Cartesian coordinate system as it is shown in FIG. 11, a mathematical moment $M_{ij}$ can be defined by:

$$M_{ij} = \int dx\, dy\, x^i y^j f(x, y) \qquad (1)$$

The centroid of the irradiance distribution is then given by $$x_0 = \frac{M_{10}}{M_{00}}, \quad y_0 = \frac{M_{01}}{M_{00}} \qquad (2)$$

Figure 11:
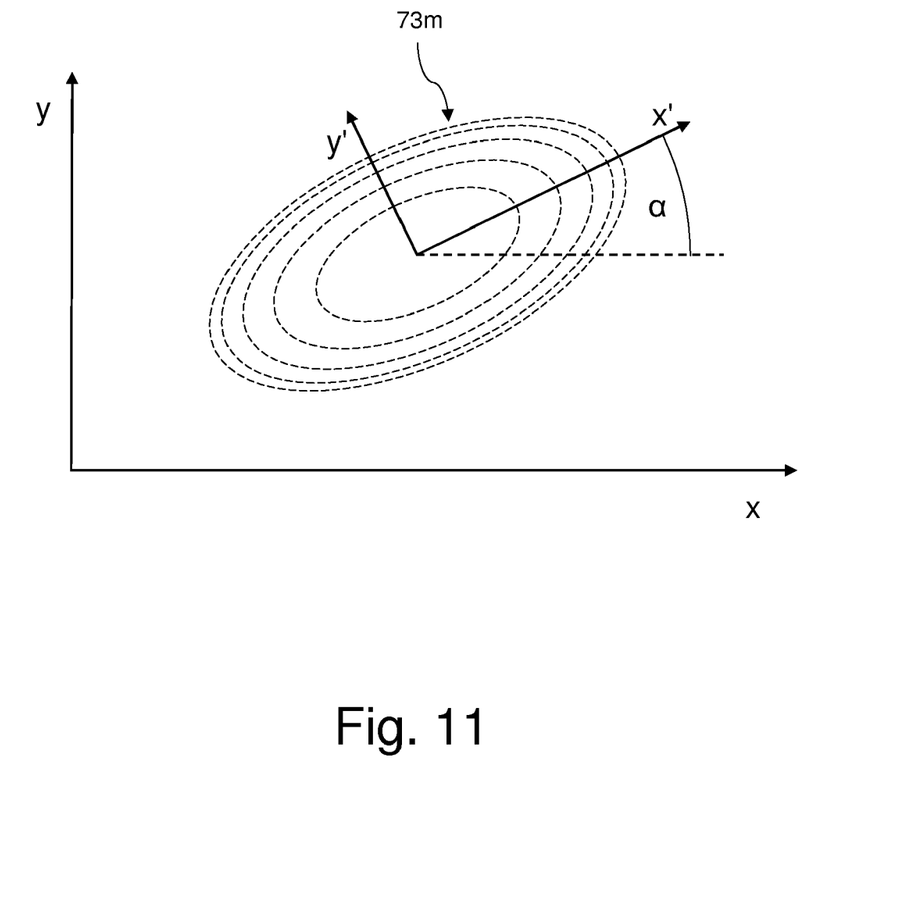
FIG. 11 is a graph illustrating the parameters that are used to describe an elliptical shape of a spot.

Now a second Cartesian coordinate system is introduced which has axes x' and y' having the same metrics, but a displaced origin and being rotated by an angle $\alpha$, as is shown in FIG. 11. The origin of this second coordinate system is positioned in the centroid of the distribution $f(x, y)$. With the same definition of the moments as given by equation (1), the centroid coordinates in the rotated second coordinate system are therefore zero:

$$M'_{10} = M'_{01} = 0 \qquad (3)$$

The length of a principal axis of the elliptic spot 73m can be defined as standard deviation in x':

$$W(\alpha) = \sqrt{\frac{M^i_{20}}{M^i_{00}}} \qquad (4)$$

The denominator in equation (4) is independent of the coordinate system:

$$M'_{00} = \int dx\, dy\, f(x, y) = M_{00} \qquad (5)$$

The numerator in equation (4) is defined by $$M'_{20} = \int dx\, dy\, x'^2 f(x, y) \qquad (6)$$

With $$x' = (x-x_0)\cos\alpha + (y-y_0)\sin\alpha \qquad (7)$$

the nominator can be written on the basis of mathematical moments expressed in the first coordinate system:

$$M^i_{20} = \left(M_{20} - \frac{M^2_{10}}{M_{00}}\right)\cos^2\alpha + \qquad (8)$$
$$\left(M_{02} - \frac{M^2_{01}}{M_{00}}\right)\sin^2\alpha + \left(2M_{11} - 2\frac{M_{10}M_{01}}{M_{00}}\right)\cos\alpha\sin\alpha$$

With the constants A, B and C given by $$A = \frac{M_{20}}{M_{00}} - \frac{M^2_{10}}{M^2_{00}}, \; B = \frac{M_{02}}{M_{00}} - \frac{M^2_{01}}{M^2_{00}}, \; C = 2\frac{M_{11}}{M_{00}} - 2\frac{M_{10}M_{01}}{M^2_{00}} \qquad (9)$$

the variance in x' (i.e. square of standard deviation) can be written as $$W^2(\alpha) = A\cos^2\alpha + B\sin^2\alpha + C\cos\alpha\sin\alpha \qquad (10)$$

By replacing $\alpha$ by $\alpha+\pi/2$, the variance in y' is obtained as $$Z^2(\alpha) = A\sin^2\alpha + B\cos^2\alpha - C\cos\alpha\sin\alpha \qquad (11)$$

In order to determine the orientation of the principal axes, the extreme values of the standard deviation W have to be found. Since these extreme values coincide with the extreme values of $W^2$, it suffices to determine the zeroes of the following equation:

$$\frac{d}{d\alpha}W^2 = 2(B-A)\cos\alpha\sin\alpha + C(\cos^2\alpha - \sin^2\alpha) \quad (12)$$

From this it follows $$C\tan^2\alpha + 2(B-A)\tan\alpha - C = 0 \quad (13)$$

with the solutions $$\tan\alpha = \frac{A - B \pm \sqrt{(A-B)^2 + C^2}}{C} \quad (14)$$

From equation (14) two angles α are obtained, with one angle indicating the orientation of the longer principal axis and the other angle indicating the orientation of the shorter principal axis. This allocation can be simply obtained if one of the angles is computed with the help of equation (14), and then the standard deviations W and Z are determined. The larger of the values is then allocated to the longer principal axis, and the smaller value is allocated to the shorter principal axis.

Practically it is not possible to measure the continuous irradiance distribution $f(x, y)$, but only a set of discrete measurement values. Then the integrals in the above equations have to be replaced by sums over all measurement points. In order to keep the measurement errors small, the measurement points should be uniformly distributed over the spot $73m$, as it is ensured with the embodiments described above in sections IV and V.

Since the absolute values of the irradiancies have no impact on the parameters α, W and Z, it is not necessary to normalize the measurement values with respect to the number and size of the measurement points.

Solving equation (14) involves the inverse computation of a trigonometric function. If such a computation involves too much computational power, look-up tables may be used instead. Alternatively, the computation may be performed by using an iterative method in which α is successively varied in steps.

The above explained approach has the advantage that the amount of data which has to be processed in each processing step is very small. More particularly, the following data have to be processed in the single steps:

(a) On the basis of the raw data provided by the spot shape measuring 106 the six different moments occurring in equation (9) have to be computed.
(b) On the basis of three of these mathematical moments the centroid of the distribution is determined.
(c) On the basis of all six moments the constants A, B and C are determined.
(d) On the basis of the three constants A, B and C the parameters α, W and Z are determined. This is the most complex computation, and therefore it may be distributed among two different computational units, for example a digital signal processor (DSP) for the more complex computations, and a simpler computational unit (for example an FPDA or CPLD) for the simpler computations.

VII.

EUV Illumination System

Figure 12:
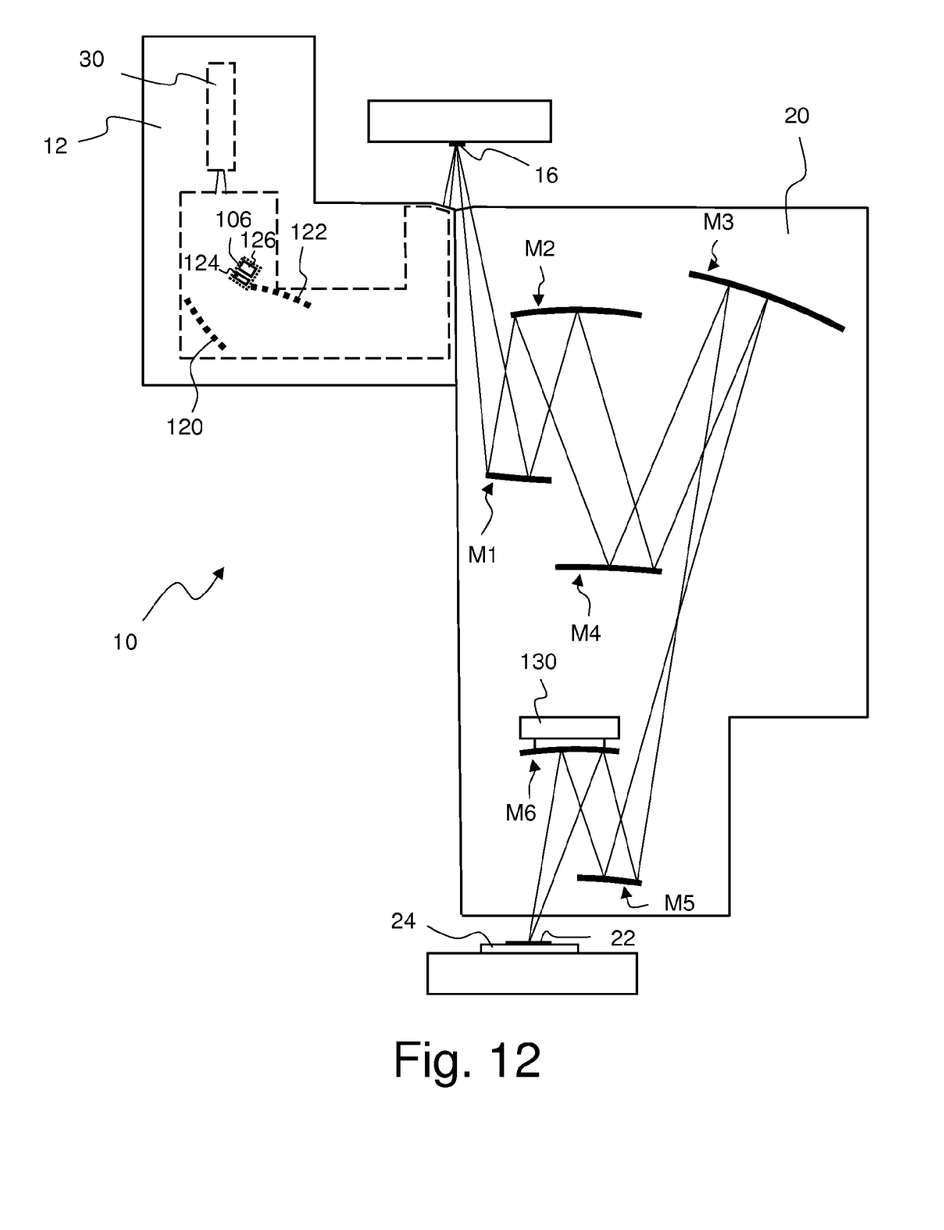
FIG. 12 is a schematic simplified meridional section through an EUV projection exposure apparatus in which the present disclosure is incorporated.

The present disclosure is also applicable in EUV projection exposure apparatus. FIG. 12 is a schematic illustration of an EUV projection exposure apparatus 10 including an illumination system 12 with an EUV radiation source 30, a reflective mask 16 and a projection objective 20. The radiation source produces light having a wavelength below 25 nm, such as about 13.6 nm. The objective 20 includes six mirrors M1 to M6, which form a reduced image of the mask 16 on a light sensitive surface 22 applied on a support 24.

The illumination system 12 includes a first faceted mirror 120 and a second faceted mirror 122 which are sometimes also referred to as field facet mirror and pupil facet mirror. A spot shape measuring unit 106 is arranged adjacent to the second faceted mirror 122 so that it is capable of measuring the shapes of spots produced by the facets of the first faceted mirror 120. The spot shape measuring unit 106 is a scintillation detector including a scintillator 124, which converts the EUV radiation to light having a longer wavelength, and an electronic light sensor 126. The electronic light sensor 126 may have a detector surface as has been described above with reference to FIGS. 5 to 10. Principally the same considerations apply to this EUV illumination system 12 as have been explained above with reference to FIGS. 1 to 11.

The above description of exemplary embodiments has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

The invention claimed is:

1. An illumination system having a surface, the illumination system comprising:
   a) an array of reflective or transparent beam deflecting elements, wherein each beam deflecting element is configured to produce on the surface a projection light spot at a position that is variable by changing a deflection angle produced by the beam deflecting element,
   b) a spot shape measuring unit which is configured to measure the shapes of spots which are produced on the spot shape measuring unit by the beam deflecting elements, wherein the spot shape measuring unit is arranged outside of every possible path projection light is allowed to take between the array and the mask, and
   c) a control unit which is configured to control the beam deflecting elements,
   wherein the control unit is configured such that, at a given instant during an exposure operation of the apparatus, at least one beam deflecting element directs projection light exclusively on the spot shape measuring unit, and at least some beam deflecting elements direct projection light exclusively on the surface, and the illumination system is configured to be able to illuminate a mask in a microlithographic projection exposure apparatus.

2. The system of claim 1, wherein the surface extends in a plane which intersects the spot shape measuring unit.

3. The system of claim 2, wherein the surface has a maximum usable area which exclusively contributes to the illumination of the mask, and the spot shape measuring unit is spaced apart from the area by a distance which is less then one fifth of a maximum diameter of the area.

4. The system of claim 1, wherein the control unit is configured to control the at least one beam deflecting element such that the spot produced by the at least one beam deflecting element moves over a detector surface of the spot shape measuring unit during the spot shape measurement.

5. The system of claim 4, wherein the detector surface comprises an array of sensor elements each having a light entrance window, and the sensor elements are spaced apart along a direction by a distance that is greater than the length of the light entrance windows along the direction.

6. The system of claim 4, wherein the control unit is configured to control the at least one beam deflecting element such that the spot meanders over the detector surface.

7. The system of claim 1, wherein the projection light has a wavelength below 25 nm, and wherein the spot shape measuring unit is a scintillation detector comprising a scintillator and an electronic light sensor.

8. The system of claim 1, wherein the illumination system comprises an evaluation unit which is configured to compute, on the basis of measurement values produced by the spot shape measuring unit, a set of parameters that describe the shape of a measured spot.

9. The system of claim 8, wherein the spots have approximately the shape of an ellipse, and the parameters include the center of the ellipse and the length and orientation of the principles axes of the ellipse.

10. The system of claim 9, wherein the evaluation system is configured to determine the parameters on the basis of mathematical moments $M_{ij}$ given by $$M_{ij} = \sum_{x,y} x^i y^j f(x, y)$$

wherein x and y are coordinates where irradiances f(x, y) are measured by the spot shape measuring unit.

11. A method, comprising:
a) producing a plurality of projection light beams;
b) directing at least one projection light beam on a spot shape measuring unit of an illumination system of a microlithographic projection exposure apparatus, the spot shape measuring unit being outside of every possible path projection light is allowed to take between an array of the illumination system and a mask of the microlithographic projection exposure apparatus;
c) measuring the shape of a spot that is produced by the at least one projection light beam on the spot shape measuring unit, and
d) directing the other projection light beams on a surface of the illumination system, wherein at least a portion of the light on the surface contributes to an illumination of the mask.

12. The method of claim 11, wherein the at least one projection light beam moves over a detector surface of the spot shape measuring unit during the spot shape measurement.

13. The method of claim 11, further comprising arranging the spots on the surface, thereby taking into account the shapes of the spots measured in step c).

14. The method of claim 11, further comprising:
e) measuring the shape of a spot produced by the at least one projection light beam on the spot shape measuring unit; and
f) arranging the spots on the surface, thereby taking into account the shapes of the spots measured in step e).

* * * * *

UNITED STATES PATENT AND TRADEMARK OFFICE
CERTIFICATE OF CORRECTION

PATENT NO. : 8,164,046 B2
APPLICATION NO. : 12/504591
DATED : April 24, 2012
INVENTOR(S) : Andras G. Major It is certified that error appears in the above-identified patent and that said Letters Patent is hereby corrected as shown below:

Column 14, line 21-24, delete " $W(\alpha) = \sqrt{\frac{M_{20}^i}{M_{00}^i}}$ ", insert -- $W(\alpha) = \sqrt{\frac{M'_{20}}{M'_{00}}}$ --.

Column 14, line 42, delete " $M_{20}^i$ ", insert -- $M'_{20}$ --.

Signed and Sealed this
Thirty-first Day of July, 2012

David J. Kappos
*Director of the United States Patent and Trademark Office*